United States Patent

[11] 3,607,379

[72] Inventors Charles Z. Leinkram
Bowie;
Richard L. Prom, Oxon Hill, both of Md.

[21] Appl. No. 699,724
[22] Filed Jan. 22, 1968
[45] Patented Sept. 21, 1971
[73] Assignee The United States of America as respresented by the Secretary of the Navy

[54] MICROELECTRONIC INTERCONNECTION SUBSTRATE
5 Claims, 3 Drawing Figs.

[52] U.S. Cl. .......... 117/212, 29/197, 29/199, 117/217
[51] Int. Cl. .......... B44d 1/18, C23b 5/56
[50] Field of Search .......... 117/212, 217; 29/589–591, 197, 199; 156/17, 8

[56] References Cited

UNITED STATES PATENTS

| | | | |
|---|---|---|---|
| 3,449,828 | 6/1969 | Solberg et al. | 29/620 |
| 3,413,711 | 12/1968 | Brewer et al. | 117/217 X |
| 3,401,055 | 9/1968 | Langdon et al. | 117/212 |
| 3,392,442 | 7/1968 | Napier et al. | 29/589 X |
| 3,381,256 | 4/1968 | Schuller et al. | 117/217 X |
| 2,799,600 | 7/1957 | Scott | 117/211 |
| 2,793,420 | 5/1957 | Johnston et al. | 29/590 |

*Primary Examiner*—Alfred L. Leavitt
*Assistant Examiner*—Alan Grimaldi
*Attorneys*—R. S. Sciascia and A. L. Branning

ABSTRACT: An interconnection substrate is disclosed for use in hybrid microelectronic systems interconnecting transistors, resistive elements, semiconductor-integrated circuits, and other microelectronic circuit elements. The substrate consists of an insulative base and three metal films, for example, a first chromium film, a second gold film metallurgically bonded to the chromium film, and a third nickel film bonded to the gold.

The interconnection substrate is prepared by (sequential) deposition of chromium, gold, and nickel onto a ceramic wafer. Alternatively the nickel film may be plated by other conventional methods. The desired circuit is then etched photolithographically to produce nickel pads for tin-lead soldered or welded connections. A second etching is made to produce gold pads suitable for thermal compression bonding, ultrasonic wire bonding and gold-silicon eutectic bonding. Circuits elements in the form of chips are then connected to the connection substrate and the entire unit encapsulated in a suitable protective material.

INVENTORS
RICHARD L. PROM
CHARLES Z. LEINKRAM

BY

ATTORNEY

INVENTORS

RICHARD L. PROM
CHARLES Z. LEINKRAM

BY

ATTORNEY

MICROELECTRONIC INTERCONNECTION SUBSTRATE

The invention described herein may be manufactured and used by or for the Government of the United States of America for governmental purposes without the payment of any royalties thereon or therefor.

BACKGROUND OF INVENTION

1. Field of the Invention

This invention relates to metal-coated insulative substrates and particularly to a microelectronic interconnection substrate. More particularly the invention relates to a substrate which provides in one unit a metallic coated element to which electronic components may be wire-bonded, chip-bonded, welded or soldered, so that a hybrid microelectronic system can be fabricated.

2. Description of the Prior Art

In the field of microelectronic interconnection substrates, it has been the general practice to employ gold-coated ceramic wafers to interconnect the various resistive elements, transistors, integrated circuits, and other circuit elements. While the gold film provides excellent thermal compression and ultrasonic wire bondability and good gold-silicon eutectic solderability for chip bonding, the gold is not suitable for parallel gap welding or tin-lead soldering of components or external connections to the interconnection substrate. Where gold has been electroplated on nickel to improve the weldability or solderability, added problems have occurred dne to the nickel film being undercut while etching which causes the gold film to lift from the substrate.

SUMMARY OF THE INVENTION

This invention, for the first time, provides a microelectronic substrate which allows wire- or chip-bonding processes to be used to connect microelectronic elements to a substrate and at he same time provides weldable or tin-lead solderable connections on the same substrate. The new capability of microwelding and standard soldering to an interconnection substrate reduces cost, simplifies manufacturing operations, appreciably improves electronic and physical stability and provides the capability of welding or soldering circuit elements or leads which cannot be ordinarily done on a gold film substrate.

It is therefore an object of this invention to provide a single microelectronic interconnection substrate for use in hybrid microelectronics capable of gold silicon eutectic bonding, thermal compression bonding, ultra sonic wire bonding, parallel gap welding, or tin-lead soldering.

Another object is to provide an interconnection microelectronic substrate extremely resistant to physical abuse while at the same time relatively inexpensive and easy to manufacture.

A further object of the invention is the provision for capability, in a unitary gold film interconnection substrate, of connecting microelectronic elements normally incapable of being connected to a gold substrate.

BRIEF DESCRIPTION OF DRAWINGS

Other objects and many of the attendant advantages of this invention will be readily appreciated as the same becomes better understood by reference to the following detailed description when considered in connection with the accompanying drawings, in which like reference numerals designate like parts throughout the figures thereon and wherein:

Referring now to FIG. 1, there is shown the steps used to manufacture the novel interconnection substrate of this invention.

Figures 1, 1A:
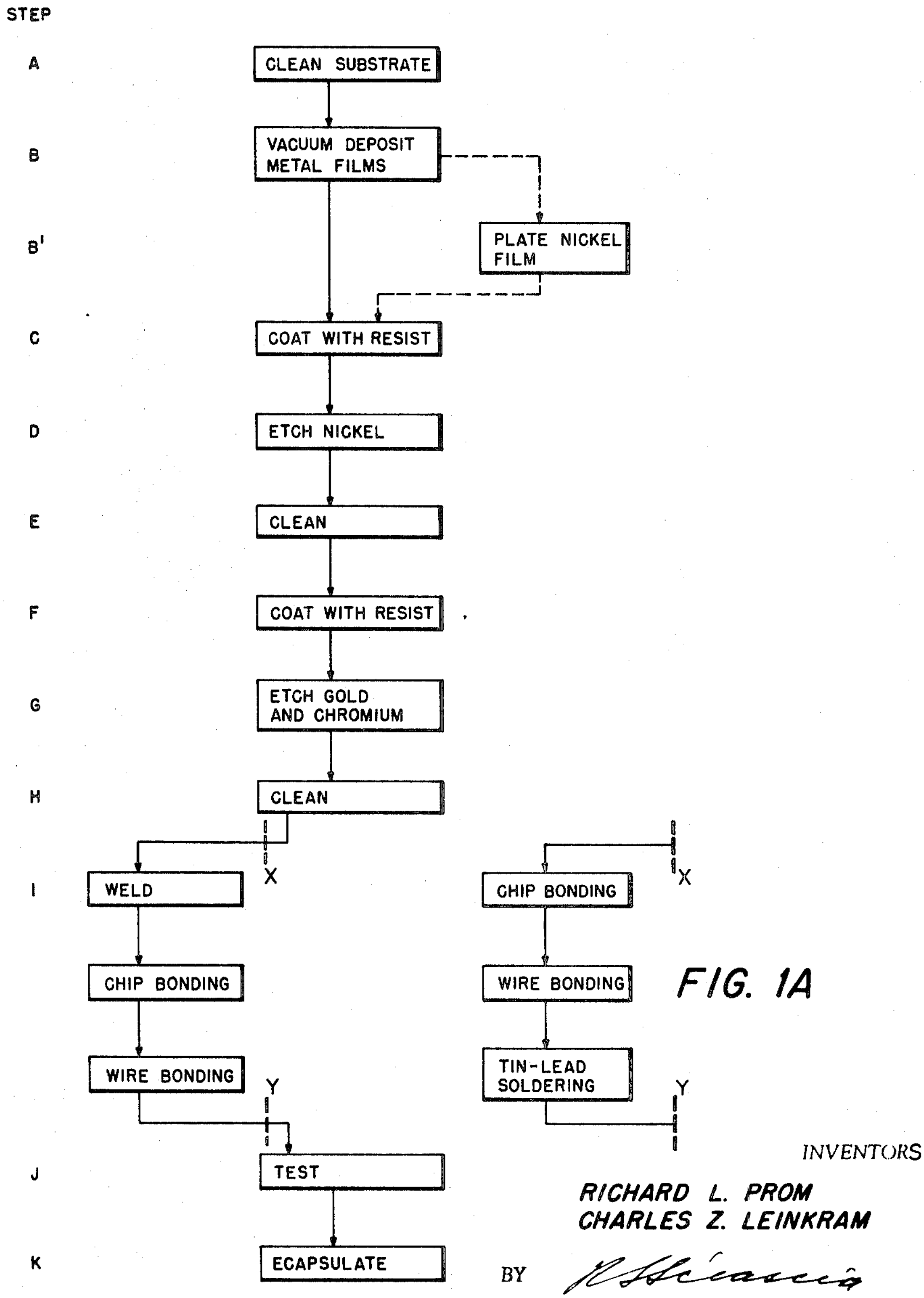
FIG. 1 shows a schematic diagram of the method for forming the novel interconnection substrates of this invention.
FIG. 1A shows an alternative technique for connecting microelectronic elements.

An inorganic substrate, for example, alumina, glass, beryllia is cleaned as is shown in step A of FIG. 1. For purposes of example, an alumina substrate is cleaned in hot chromic acid followed by a rinse in deionized water, a subsequent rinse in alcohol, and drying in a gaseous nitrogen atmosphere. Obviously any of the well-known cleaning methods for inorganic substrates may be employed; the particular method used depends upon the substrate material selected for coating and on the users.

Metallic films are then applied to form a continuous film over the entire surface of the substrate (step B). In this step a metal is first bonded to the alumina substrate to act as an adhesive holding subsequently deposited metal films to the inorganic substrate. Metals capable of providing these adhesive metallurgical bonds are chromium, titanium, aluminum, or the like. Chromium is particularly preferred for bonding gold to an alumina substrate because of its unusually adherent adhesive nature.

The second metal layer applied is one which forms good low-temperature eutectic compositions with semiconductors such as gold, silver or the like. Gold is particularly preferred because of the excellent eutectic formed with silicon semiconductors.

The third metal film applied to the substrate is a weldable metal such as rhodium, silver, copper, nickel or the like. Nickel or copper is particularly preferred being solderable and weldable and allowing physically stable electrical connections to be made which are far superior than similar connections to gold-nickel layers. For electroless plating, nickel is a preferred medium because of handling ease and adhesive qualities.

The metal films are deposited by placing the substrates to be coated in a vacuum deposition chamber and outgassing to $2\times10^{1}$or lower while heating the substrate to 300° C. Chromium is then allowed to sublime and coat the substrate surface.

When the desired chromium film thickness has been obtained, the chromium deposition is stopped. Gold is next allowed to evaporate and deposit on the chromium coated substrate to form a continuous gold film over the entire surface of the substrate. On reaching the desired gold film thickness evaporation of gold is stopped and evaporation of nickel begun. Again the uniformly thick and controlled nickel coating is applied to the entire substrate surface area.

Where it is desired to produce large quantities of substrates, at the lowest possible cost, the nickel film may be applied by removing the substrates from the deposition chamber and placing them in a nickel plating bath where the substrates are either electroplated or electroless plated. Any conventional electroless plating bath may be employed. We use a solution which contains nickelous chloride, ammonium chloride, sodium citrate, ammonium hydroxide, sodium hypophosphate, and water. The nickel plating step not only saves in time and labor but produces a nickel film which is etchable, weldable and possesses good adhesion to the gold layer.

The substrate having three metallic layers is next photolithographically etched to prepare nickel pads suitable for dielectric welding or tin-lead soldering as is shown by steps C, D, and E of FIG. 1. The entire substrate surface is coated with resist, for example, "Kodak Metal Etched Resist," or the like. The resist coating is masked, exposed to light, developed and cured. After curing unpolymerized resist is removed leaving the nickel-pad areas coated with polymer and gold-pad areas free of polymer.

The substrate is etched (step D) to remove nickel from those areas which are to be nickel free. A saturated ferric chloride solution containing 10 cc. of concentrated hydrochloric acid for each 100 cc. of saturated ferric chloride solution is used to remove the exposed nickel coating. The etched substrate is then thoroughly washed to remove residual etching solution and is dried.

The resist coating is next removed (step E) with a suitable solvent such as $CHCL_2$–$CH_2CL$, $CCL_4$, $CHCL_3$ or the like. After stripping the substrate is again washed and dried.

A second photolithographic etching is done to prepare gold pads suitable for chip bonding and wire bonding as is shown by steps F, G and H of FIG. 1. Resist is polymerized as discussed previously so as to coat areas where it is desired to have a gold pad for mounting the various microelectronic components. The coated substrate is first etched (step G) using a suitable gold etch such as saturated potassium iodine in water which is in turn saturated with free iodine. The gold etch is applied at about 50° C. A second etch consisting of potassium ferricyanide (saturated solution) containing several drops of ammonia is used to etch the chromium film. The etched substrate is cleaned and dried (step H) and is ready to receive the various microelectronic components to be interconnected on one unitary circuit component.

The fabrication of the prepared interconnection substrate is shown by step I of FIG. 1. Leads to the external circuit are welded to the nickel pads. Transistors, diodes, integrated circuit chips, etc., are then chip bonded to the gold pads by the formation of a silicon-gold eutectic. Resistor elements are similarly connected to the gold pads. Gold wire is bonded to various elements of the circuit and to the gold portions of the nickel pads to complete the circuit as is best illustrated by the simple diode configuration shown by FIG. 2.

FIG. 1A describes an alternative method whereby the diodes, resistors, etc., are first chip bonded to the substrate and then interconnected by gold wire. External leads are finally soldered to the nickel pads.

When the entire microelectronic interconnected substrate has been completed it is tested (step J) and on meeting the quality control criteria is encapsulated (step K) with a suitable coating for example epoxy, polyurethane, silicones, or the like.

Figure 2:
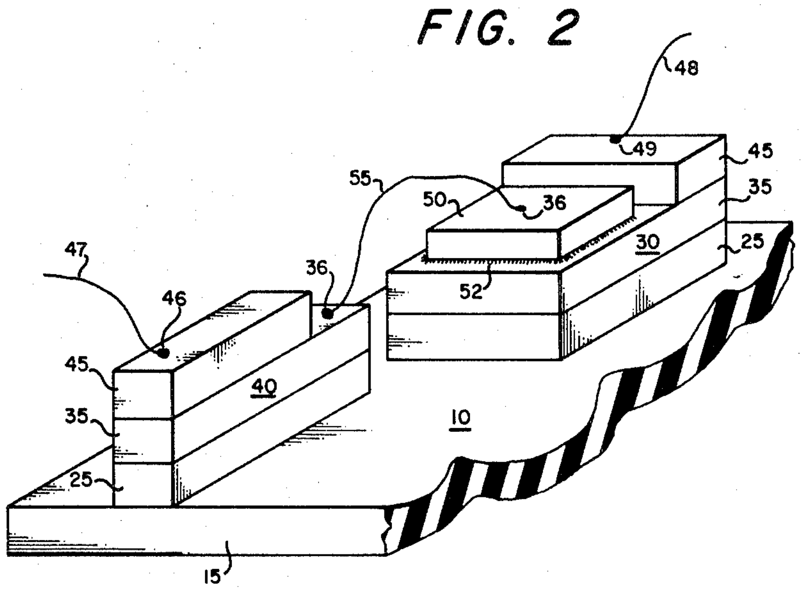
FIG. 2 shows a perspective view of part of the novel interconnect substrate of this invention.

FIG. 2 is a simplified example of a novel interconnection substrate of this invention. The interconnection substrate 10 is shown in simple diode configuration or purposes of illustration. The substrate 10 consists of an insulative alumina ceramic wafer 15, or equivalent, which serves to electrically insulate the separate pads. The wafers are usually about 1 inch square by 25 mils in thickness on which is deposited metal films of controlled thickness.

Three sequentially deposited films are shown on substrate 15 namely, a first metal layer 25 of chromium, for example, to metallurgically bond a second silicon-eutectic-forming layer such as, gold 35 to the substrate 15. Deposited on the gold layer is a third weldable or tin-lead solderable layer such as the nickel film 45.

The metal films are shown photolithographically etched, as described by FIG. 1, to produce a number of gold and nickel pads suitable for interconnecting microelectronic elements. Diode 50, for example, is shown connected by a gold-silicon eutectic bond 52 to the gold pad 30. The *n*-lead 48 of the diode is shown welded at 49 to a nickel pad 45. The diode *p*-lead 47 is shown soldered at 46 to a nickel pad 45 which is interconnected by gold wire 55 thermally bonded at 36 to the diode 50 and gold pad 40.

The gold film or pad shown in FIG. 2 provides a surface to which resistive elements, semiconductors and other components may be interconnected by means of gold-silicon eutectic formation and by gold wires attached by thermal compression and/or ultrasonic bonding. The nickel pads provide surfaces to which microcomponents and/or external leads are tin-lead soldered or welded.

A completed interconnection substrate may of course contain many semiconductors integrated circuits, resistive elements and/or other microelectronic components encapsulated by a protective coating (not shown) to form a hybrid microelectronic system.

This invention provides an improved insulative substrate for interconnections of microelectronic components. The substrate is designed to allow conventional gold bonding of components but to also provide for application of tin-lead soldering and dielectric welding techniques on the same substrate to yield a hybrid microelectronic system. This gives a far more reliable completed microelectronic unit at lower cost prepared in a simpler manner and by a less critical process.

Obviously many modifications and variations of the present invention are possible in the light of the above teachings. It is therefore to be understood, that within the scope of the appended claims, the invention may be practiced otherwise than as specifically described. What is claimed and desired to be secured by Letters Patent of the United States is:

1. A microelectronic interconnection substrate comprising:
an insulative base;
a thin film of chromium deposited on at least a portion of said base;
a thin film of noble metal deposited on at least a portion of said chromium; and,
a weldable electrically conductive film selected from the group consisting of rhodium, silver, copper, and nickel deposited on at least a portion of said noble metal, said weldable film and noble metal film forming pads suitable for interconnecting microelectronic elements.

2. The interconnection substrate of claim 1 wherein said films are divided into a plurality of separate pads having at least two of said films, the pads being electrically insulated from each other.

3. The interconnection substrate of claim 2 including microcircuit elements connected to said pads and interconnected in a predetermined pattern.

4. The interconnection substrate of claim 1 wherein said noble metal is gold and said weldable film is nickel.

5. The interconnection substrate of claim 3 wherein said substrate is encapsulated in a protective coating.